US008664057B2

(12) United States Patent
Pal et al.

(10) Patent No.: US 8,664,057 B2
(45) Date of Patent: Mar. 4, 2014

(54) HIGH-K METAL GATE ELECTRODE STRUCTURES FORMED BY EARLY CAP LAYER ADAPTATION

(75) Inventors: Rohit Pal, Clifton Park, NY (US); Sven Beyer, Dresden (DE); Andy Wei, Dresden (DE); Richard Carter, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/565,970

(22) Filed: Aug. 3, 2012

(65) Prior Publication Data

US 2013/0034942 A1    Feb. 7, 2013

(30) Foreign Application Priority Data

Aug. 4, 2011    (DE) .......................... 10 2011 080 440

(51) Int. Cl.
*H01L 21/8238* (2006.01)
*H01L 21/3205* (2006.01)
*H01L 21/4763* (2006.01)
*H01L 21/336* (2006.01)
*H01L 21/28* (2006.01)
*H01L 21/44* (2006.01)
*H01L 21/8234* (2006.01)

(52) U.S. Cl.
USPC ........... 438/199; 438/585; 438/300; 438/588; 438/581; 438/926; 438/197

(58) Field of Classification Search
USPC ......... 438/197, 199, 300, 585, 216, 591, 588, 438/926
See application file for complete search history.

(56) References Cited

U.S. PATENT DOCUMENTS

| | | | |
|---|---|---|---|
| 2007/0057331 A1* | 3/2007 | Satou et al. | 257/384 |
| 2010/0087038 A1 | 4/2010 | Chung et al. | 438/199 |
| 2010/0304542 A1* | 12/2010 | Beyer et al. | 438/299 |
| 2010/0330757 A1* | 12/2010 | Lenski et al. | 438/229 |
| 2010/0330790 A1* | 12/2010 | Hempel et al. | 438/585 |
| 2010/0330808 A1 | 12/2010 | Richter et al. | 438/691 |
| 2011/0127613 A1 | 6/2011 | Beyer et al. | 257/369 |
| 2011/0186931 A1* | 8/2011 | Marxsen et al. | 257/368 |

FOREIGN PATENT DOCUMENTS

| | | | | |
|---|---|---|---|---|
| DE | 102009031146 A1 | 1/2011 | ............ | H01L 21/336 |
| DE | 102009047306 A1 | 6/2011 | .......... | H01L 21/8234 |

OTHER PUBLICATIONS

Translation of Official Communication from German Patent Office for German Patent Application No. 10 2011 080 440.4 dated Apr. 4, 2012.

* cited by examiner

*Primary Examiner* — Mary Wilczewski
*Assistant Examiner* — Erik T Peterson
(74) *Attorney, Agent, or Firm* — Amerson Law Firm, PLLC

(57) ABSTRACT

When forming high-k metal gate electrode structures in transistors of different conductivity type while also incorporating an embedded strain-inducing semiconductor alloy selectively in one type of transistor, superior process uniformity may be accomplished by selectively reducing the thickness of a dielectric cap material of a gate layer stack above the active region of transistors which do not receive the strain-inducing semiconductor alloy. In this case, superior confinement and thus integrity of sensitive gate materials may be accomplished in process strategies in which the sophisticated high-k metal gate electrode structures are formed in an early manufacturing stage, while, in a replacement gate approach, superior process uniformity is achieved upon exposing the surface of a placeholder electrode material.

20 Claims, 7 Drawing Sheets

HIGH-K METAL GATE ELECTRODE STRUCTURES FORMED BY EARLY CAP LAYER ADAPTATION

BACKGROUND OF THE INVENTION

1. Field of the Invention

Generally, the present disclosure relates to the fabrication of highly sophisticated integrated circuits including transistor elements that comprise a high-k metal gate electrode structure.

2. Description of the Related Art

The fabrication of advanced integrated circuits, such as CPUs, storage devices, ASICs (application specific integrated circuits) and the like, requires a great number of circuit elements to be formed on a given chip area according to a specified circuit layout, wherein field effect transistors represent one important type of circuit element that substantially determines performance of the integrated circuits. Currently, a plurality of process technologies are practiced, wherein, for many types of complex circuitry, including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions.

In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a planar transistor architecture, the distance between the source and drain regions, which is also referred to as channel length.

Presently, the vast majority of integrated circuits are formed on the basis of silicon due to its substantially unlimited availability, the well-understood characteristics of silicon and related materials and processes and the experience gathered during the past 50 years. Therefore, silicon will likely remain the material of choice for future circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a base material for gate insulation layers that separate the gate electrode, frequently comprised of polysilicon, from the silicon channel region. In steadily improving device performance of field effect transistors, the length of the channel region has been continuously decreased to improve switching speed and drive current capability. Since the transistor performance is controlled by, among other things, the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length for a planar transistor configuration requires an increased capacitive coupling, in combination with sophisticated lateral and vertical dopant profiles in the drain and source regions to avoid the so-called short channel behavior during transistor operation. The short channel behavior may lead to an increased leakage current and to a pronounced dependence of the threshold voltage on the channel length. Aggressively scaled planar transistor devices with a relatively low supply voltage and thus reduced threshold voltage may suffer from an exponential increase of the leakage current due to the required enhanced capacitive coupling of the gate electrode to the channel region. Thus, the thickness of the silicon dioxide layer has to be correspondingly reduced to provide the required capacitance between the gate and the channel region. For example, a channel length of approximately 0.08 µm may require a gate dielectric made of silicon dioxide as thin as approximately 1.2 nm. Thus, relatively high leakage currents are caused by the direct tunneling of charge carriers through an ultra-thin silicon dioxide gate insulation layer and may reach values for an oxide thickness in the range of 1-2 nm that may no longer be compatible with requirements for many types of circuits.

For this reason, new strategies have been developed in overcoming the limitations imposed by high leakage currents of extremely thin silicon oxide-based gate insulation layers. One very promising approach is the replacement of the conventional dielectric materials, at least partially, by dielectric materials having a dielectric constant that is significantly greater than the dielectric constant of silicon dioxide-based materials. For example, dielectric materials, also referred to as high-k dielectric materials, with a dielectric constant of 10.0 and significantly higher may be used, for instance in the form of hafnium oxide, zirconium oxide and the like. In addition to providing a high-k dielectric material in the gate insulation layers, appropriate metal-containing materials may also have to be incorporated since the required work function values for P-channel transistors and N-channel transistors may not be obtained on the basis of standard polysilicon gate materials. To this end, appropriate metal-containing materials may be provided so as to cover the sensitive high-k dielectric materials and act as a source for incorporating an appropriate metal species, such as lanthanum, aluminum and the like, in order to appropriately adjust the work function for N-channel transistors and P-channel transistors, respectively. Furthermore, due to the presence of a metal-containing conductive material, the generation of a depletion zone, as may typically occur in polysilicon-based electrode materials, may be substantially avoided. The process of fabricating a sophisticated gate electrode structure on the basis of a high-k dielectric material may require a moderately complex process sequence because of, for instance, the adjustment of an appropriate work function for the transistors of different conductivity type and the fact that high-k dielectric materials may typically be very sensitive when exposed to certain process conditions, such as high temperatures in the presence of oxygen and the like. Therefore, different approaches have been developed, such as providing the high-k dielectric material at an early manufacturing stage and processing the semiconductor devices with a high degree of compatibility with standard process techniques, wherein, in the typical electrode material, polysilicon may be replaced in a very advanced manufacturing stage with appropriate metals for adjusting the work function of the different transistors and for providing a highly conductive electrode metal. While this approach may provide superior uniformity of the work function and thus of the threshold voltage of the transistors, since the actual adjustment of the work function may be accomplished after any high temperature processes, a complex process sequence for providing the different work function metals in combination with the electrode metal may be required. In other very promising approaches, the sophisticated gate electrode structures may be formed in an early manufacturing stage, while the further processing may be based on the plurality of well-established process strategies. In this case, the high-k dielectric material and any metal species for adjusting the work function may be provided prior to or upon patterning the gate electrode stack, which may comprise well-established materials, such as silicon and silicon/germanium, thereby enabling the further processing on the basis of well-established process techniques. On the other hand, the gate electrode stack and in particular the sensitive high-k dielectric materials in combination with any metal-containing cap layers have to be reliably confined by appropriate materials throughout the entire processing of the semiconductor device.

Further concepts for enhancing performance of transistors have been developed by providing a plurality of strain-inducing mechanisms in order to increase the charge carrier mobility in the channel regions of the various transistors. It is well known that charge carrier mobility in silicon may be efficiently increased by applying certain strain components, such as tensile and compressive strain for N-channel transistors and P-channel transistors, respectively, so that superior transistor performance may be obtained for an otherwise identical transistor configuration compared to non-strained silicon materials. For instance, efficient strain-inducing mechanisms may be implemented by incorporating a strained semiconductor material in the drain and source regions of transistors, for instance in the form of a silicon/germanium alloy, a silicon/carbon alloy and the like, wherein the lattice mismatch between the semiconductor alloy and the silicon base material may result in a tensile or compressive state, which in turn may induce a desired type of strain in the channel region of the transistor. Other efficient strain-inducing mechanisms are well established in which a highly stressed dielectric material may be positioned in close proximity to the transistor, thereby also inducing a certain type of strain in the channel region.

Although the approach of providing a sophisticated high-k metal gate electrode structure in combination with additional strain-inducing mechanisms may have the potential of providing extremely powerful semiconductor devices, such as CPUs, storage devices, systems on a chip (SOC) and the like, conventional approaches may still suffer from process non-uniformities, as will be described with reference to FIGS. 1a-1c.

FIG. 1a schematically illustrates a cross-sectional view of a semiconductor device 100 comprising a substrate 101, such as a silicon substrate, in combination with a semiconductor layer 102, such as a silicon layer or a semiconductor material which contains a significant amount of silicon. In the manufacturing stage shown, the semiconductor device 100 comprises transistors 150a, 150b formed in and above respective active regions 102a and 102b. An active region is to be understood as a semiconductor region in the layer 102 in which PN junctions for one or more transistors are to be formed. An isolation structure 102c, such as a trench isolation, is provided in the semiconductor layer 102 and may be formed so as to be adjacent to the active region 102a, wherein it should be appreciated that the isolation structure 102c may also be provided laterally between the active regions 102a, 102b, thereby electrically isolating these regions, at least in the horizontal direction. Furthermore, a plurality of gate electrode structures 160a, 160b and 160c are formed above the semiconductor layer 102. In FIG. 1a, the gate electrode structures 160a, 160b are illustrated at a cross-section in which the gate electrode structures 160a, 160b are formed on the active regions 102a and 102b, respectively, wherein it should be appreciated that these gate electrode structures typically extend beyond the corresponding active region and thus these gate electrode structures may also be formed above the isolation region 102c. For example, the gate electrode structure 160c may represent a corresponding portion of a gate electrode structure that may extend into an active region along the direction perpendicular to the drawing plane of FIG. 1a. In other cases, the gate electrode structure 160c may represent a portion of the gate electrode structure 160a. In other words, in this case, the gate electrode structure 160c may represent a "continuation" of the gate electrode structure 160a in a direction perpendicular to the drawing plane of FIG. 1a. At any rate, the gate electrode structure 160c may be formed above a portion of the isolation structure 102c, which is in close proximity to the active region 102a.

As previously discussed, the gate electrode structures may comprise a gate insulation layer 161 formed on the active regions 102a, 102b, respectively, and the gate insulation layer 161 may comprise a high-k dielectric material, such as hafnium oxide-based materials and the like. It is to be noted that, frequently, the gate insulation layer 161 may additionally comprise a conventional dielectric material, such as a silicon oxide-based material, however, with a significantly reduced thickness of approximately 0.8 nm and less. Furthermore, a metal-containing material is typically formed on the gate insulation layer 161 when comprising the high-k dielectric material, wherein the corresponding metal-containing material may be provided with different material composition for transistors of different conductivity type in order to adjust an appropriate work function for the corresponding gate electrode structure. For example, a conductive cap layer 162a is provided in the gate electrode structures 160a, 160c, which may correspond to the same conductivity type of a transistor. Thus, the cap layer 162a typically has incorporated therein a work function metal species for the transistor 150a, while a conductive cap layer 162b includes an appropriate work function metal species for the transistor 150b. Furthermore, the gate electrode structures may comprise a further electrode material 163, such as silicon, silicon/germanium and the like, followed by a dielectric cap layer or layer system, which, however, may have a different thickness for the gate electrode structures 160a, 160c on the one hand, and the gate electrode structure 160b on the other hand, due to a different exposure to reactive process atmospheres applied during the previous processing. Thus, the dielectric cap layers 164a of the structures 160c, 160a may have a thickness of, for instance, 20-40 nm, while the thickness of the cap layer 164b may be greater by approximately 15-25 nm.

Furthermore, a sidewall spacer structure 165, for instance comprising a liner material 165a in combination with a spacer element 165b, may be provided so as to protect the sidewalls of the electrode material 163, and in particular of the sensitive materials 162a, 162b and 161. The liner 165a and the spacer element 165b are typically comprised of silicon nitride. As illustrated, the materials of the components 165a, 165b may be provided in the form of a non-patterned layer system above the active region 102b and the gate electrode structure 160b so as to act as an efficient mask material during a process sequence for forming a strain-inducing semiconductor material 151, such as a silicon/germanium material, in the active region 102a. As discussed above, in sophisticated applications, performance of P-channel transistors may be significantly increased upon incorporating a strain-inducing silicon/germanium alloy into the active region of the P-channel transistor, since in this case a significant compressive strain may be induced in a channel region 153. It should be appreciated that, if required, a threshold adjusting semiconductor material, indicated as 153a, may be provided in the channel region 153, if required for appropriately adjusting the overall threshold voltage of the transistor 150a.

The semiconductor device 100 as illustrated in FIG. 1a may be formed on the basis of the following process strategies. After forming the isolation region 102c and thus laterally delineating the active regions 102a, 102b and any other active regions, the material layer 153a, if required, may be formed selectively in the active region 102a. Next, appropriate materials for the gate insulation layer 161 and the layers 162a, 162b may be formed by appropriate deposition techniques and patterning sequences, possibly in combination with any thermal treatments in order to diffuse a work function metal species into the gate dielectric layers 161, if considered appropriate. In other cases, a desired work function metal species may be deposited in the form of a continuous material layer, which may then be patterned so as to form a desired material layer above the corresponding active regions. Thereafter, the electrode material 163, for instance in the form of amorphous and/or polycrystalline silicon, is deposited by using well-established deposition techniques, followed by the deposition of the dielectric cap layer or layer system 164a, 164b. If required, any additional materials, such as anti-reflective coating (ARC) materials and the like, may be provided, if required, and a sophisticated lithography process sequence and anisotropic etch processes are applied in order to obtain the gate electrode structures 160a, 160b, 160c according to the design rules. For example, a length of the gate electrode structures, i.e., the horizontal extension of the electrode materials 162a, 162b, may be 50 nm and less. Next, the material layers 165s are deposited, for instance, by thermally activated chemical vapor deposition (CVD), plasma enhanced CVD, low pressure CVD, multi-layer deposition techniques in order to obtain the desired material characteristics. For example, silicon nitride may be deposited so as to form a dense liner, followed by the deposition of a further silicon nitride material for the spacer elements 165b. As discussed above, when adjusting the work function and thus the basic threshold voltage of the transistors 150a, 150b upon patterning the gate electrode structures 160a, 160b, a reliable confinement of the layers 161 and 162a, 162b has to be guaranteed during the further processing since any exposure to the active process atmospheres, such as oxygen-containing chemicals and the like, may result in a significant shift of the previously adjusted transistor characteristics.

Thereafter, an etch mask (not shown) is formed so as to cover the transistor 150b while exposing the active region 102a and the portion of the isolation region 102c having formed thereon the gate electrode structure 160c. As discussed above, the gate electrode structures 160a, 160c may represent one and the same gate electrode structure or structures that are provided in close proximity and correspond to an area of P-type transistors. During the corresponding anisotropic etch processes, well-established plasma-based recipes are applied so as to etch through the previously deposited layers 165s, thereby forming the spacer structure 165 on the gate electrode structures 160c, 160a. Moreover, the etch process may be continued so as to etch into the active region 102a, possibly on the basis of a changed etch chemistry in order to form cavities therein, which are subsequently filled with the material 151. Consequently, during the cavity etch process, also the cap layers 164a are exposed to the reactive etch ambient and may thus suffer from a pronounced material erosion, which may result in the reduced thickness of these layers compared to the dielectric cap layer 164b, which may still be covered by the spacer layers 165s and corresponding resist mask.

Next, the device 100 is prepared for the selective deposition of the strain-inducing semiconductor material 151, which typically involves a plurality of cleaning recipes, which may result in a significant erosion of oxide-based materials, such as the insulating material in the isolation region 102c. Thus, a pronounced degree of recessing, indicated as 107c, is generated in the isolation region 102c, thereby also causing a certain degree of under-etching of the spacer structure 165 of the gate electrode structure 160c. Thereafter, the material 151 is selectively grown in the corresponding cavities by applying a selective epitaxial growth process based on well-established process recipes. Typically, the process parameters are selected such that a significant degree of material deposition may occur on more or less pure silicon surface areas, while dielectric surface areas, such as silicon nitride, silicon dioxide and the like, may substantially not receive the material 151.

After the incorporation of the strain-inducing semiconductor alloy 151, the processing is continued by patterning the layer 165s into spacer structures on the gate electrode structure 160b and thereafter the further processing is continued, for instance, by forming drain and source regions. Typically, prior to completing the drain and source regions, the cap layers 164a, 164b have to be removed, which may typically be accomplished on the basis of well-established wet chemical etch processes, for instance using hot phosphoric acid and the like. In this case, the etch chemistry will exhibit a pronounced selectivity with respect to semiconductor material and thus the cap layer 164b having an increased thickness 164u compared to a thickness 164t of the cap layers 164a may be efficiently removed without unduly affecting any exposed semiconductor surface area, since a corresponding over-etch time may not negatively influence any of these sensitive device areas. It turns out, however, that, in particular, wet chemical chemistries may result in a significant material erosion of the protective components in the structure 165, for instance in the area of the recesses 107c, thereby contributing to significant yield losses due to gate failures of gate electrode structures of P-channel transistors formed in the vicinity of active regions of the P-channel transistors, such as the gate electrode structures 160a, 160c.

Hence, in other approaches, cap layers 164a, 164b are removed on the basis of a plasma assisted etch process for which a plurality of well-established process recipes are available for removing silicon nitride-based material highly selectively with respect to silicon material. In this case, however, a pronounced over-etch time for reliably removing the cap layer 164b having the increased thickness 164u may result in a pronounced reduction of the spacer structure 165, which in turn may also negatively affect the further processing of the device 100. Hence, in still other approaches, it has been proposed to form additional spacer elements and/or apply additional masking regimes, which are typically associated with further etch processes based on wet chemical etch chemistries, thereby also contributing to an enhanced probability of damaging gate electrode structures, in particular due to the recesses 107c. Consequently, even if sophisticated approaches are used, significant yield loss is observed for the device 100, when providing the sophisticated high-k metal gate electrode structures 160a, 160b in an early manufacturing stage.

As discussed above, in other advanced approaches for providing sophisticated high-k metal gate electrode structures, at least the metal-containing electrode material, possibly in combination with a high-k dielectric material, may be provided in a very late manufacturing stage. With reference to FIGS. 1b and 1c, a corresponding replacement gate approach will now be described in more detail.

FIG. 1b schematically illustrates a cross-sectional view of the semiconductor device 100 in a very advanced manufacturing stage. As shown, the gate electrode structures 160a, 160b of the transistors 150a, 150b are provided, however, contrary to the approach described above with reference to FIG. 1a, in a "conventional" configuration in which an appropriate dielectric material 161 in combination with a polysilicon material 163 is provided. As shown, the cap layers 164a, 164b are still in place and have a significant different thickness compared to the different process history with respect to providing the embedded silicon/germanium alloy 151, as discussed above. Moreover, as shown, a further sidewall spacer structure 166 is typically provided and is used for adjusting the vertical and lateral dopant profile of drain and source regions 152. Moreover, at least a portion of a contact level 120 is provided in the form of a first dielectric layer 121, such as a silicon nitride layer, followed by a further dielectric material 122, which may also be referred to as an interlayer dielectric material and which is typically provided in the form of silicon dioxide material.

The device 100 as shown in FIG. 1b may be formed on the basis of similar process techniques as described above with reference to the active regions 102a, 120b, while the gate electrode structures 160a, 160b may be formed on the basis of conventional gate materials, such as silicon dioxide, silicon oxynitride and the like for the gate dielectric layer 161 and polycrystalline or amorphous silicon material for the material 163. Moreover, with respect to forming the structure 165 and the cap layers 164a, 164b and the embedded silicon/germanium material 151, the same criteria may apply as discussed above. Thereafter, the spacer structure 166 in combination with the drain and source regions 152 may be formed by using well-established masking regimes and implantation processes, followed by any high temperature processes in order to activate the dopant species and re-crystallize implantation-induced damage. Next, the materials 121 and 122 may be deposited on the basis of any well-established deposition technique. Thereafter a material removal process or sequence 105 is applied so as to planarize and thus remove any excess material of the contact level 120. For example, frequently, the removal process 105 may comprise a chemical mechanical polishing process, possibly in combination with etch strategies and the like, in order to provide a substantially planar surface topography and to finally expose the surface of the materials 163.

FIG. 1c schematically illustrates the device 100 in a further advanced manufacturing stage. As shown, the device 100 comprises a substantially planar surface topography in order to expose a surface of the materials 163, indicated by 163s. It should be appreciated that generally the removal process for exposing the surface areas 163s is a highly complicated planarization and/or etch sequence wherein, in a final state, three different materials have to be processed wherein, in particular, the different thickness of the cap layers 164a, 164b may result in highly sophisticated process conditions. Typically, undue over-polishing may not be desirable in this final phase in order to not unduly induce material erosion of the material 122, which may result in extremely sophisticated conditions during the further processing, while keeping the material erosion at an acceptable level may result in significant residues 164r, for instance in the gate electrode structure 160b having the increased thickness of the cap layer 164b (FIG. 1b). Since any material residues, such as the residues 164r, may significantly affect the removal rate during the subsequent process sequence for removing the material 163, the replacement of the material 163 by at least a metal-containing electrode material may thus result in significant non-uniformities. Since frequently also the work function metal species and the high-k dielectric material have to be incorporated into the gate electrode structures 160a, 160b, any incomplete removal of the materials 163 may thus have a very pronounced effect on the resulting gate electrode structures and may thus cause significant yield loss in corresponding replacement gate approaches.

In view of the situation described above, the present disclosure relates to manufacturing techniques for forming sophisticated high-k metal gate electrode structures in combination with an embedded strain-inducing semiconductor alloy, while avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

One illustrative method disclosed herein comprises forming a gate layer stack above a first active region and a second active region of a semiconductor device. The gate layer stack comprises a dielectric material, at least one electrode material formed above the dielectric material and a dielectric cap material formed above the at least one electrode material. The method further comprises reducing a thickness of the dielectric cap material selectively above the second active region. Moreover, the method comprises patterning the gate layer stack having the dielectric cap material with a selectively reduced thickness so as to form a first gate electrode structure on the first active region and forming a second gate electrode structure on the second active region. Additionally, the method comprises forming a strain-inducing semiconductor alloy selectively in the first active region.

A further illustrative method disclosed herein relates to forming a semiconductor device. The method comprises forming a gate layer stack above a first active region and a second active region, wherein the gate layer stack comprises a high-k dielectric material, a metal-containing electrode material formed above the high-k dielectric material, a semiconductor-based electrode material formed above the metal-containing electrode material and a dielectric cap material that is formed above the semiconductor-based electrode material. The method further comprises reducing a thickness of the dielectric cap material selectively above the second active region. Moreover, the gate layer stack having the dielectric cap material with a selectively reduced thickness is patterned so as to form a first gate electrode structure on the first active region and a second gate electrode structure on the second active region. The method further comprises forming a strain-inducing semiconductor alloy selectively in the first active region. Additionally, the method comprises removing the dielectric cap material from the first and second gate electrode structures after forming the strain-inducing semiconductor alloy.

A still further illustrative method disclosed herein relates to forming a semiconductor device. The method comprises forming a gate layer stack above a first active region and a second active region, wherein the gate layer stack comprises a dielectric material, a placeholder electrode material formed above the dielectric material and a dielectric cap material formed above the placeholder electrode material. The method further comprises reducing a thickness of the dielectric cap material selectively above the second active region. Moreover, the method comprises patterning the gate layer stack having the dielectric cap material with a selectively reduced thickness so as to form a first gate electrode structure on the first active region and a second gate electrode structure on the second active region. Moreover, a strain-inducing semiconductor alloy is selectively formed in the first active region. The method further comprises removing the dielectric cap material from the first and second gate electrode structures after forming the strain-inducing semiconductor alloy. Additionally, the method comprises replacing the placeholder electrode material with a metal-containing electrode material after removal of the dielectric cap material.

BRIEF DESCRIPTION OF THE DRAWINGS

The disclosure may be understood by reference to the following description taken in conjunction with the accompanying drawings, in which like reference numerals identify like elements, and in which.

Figure 1A:
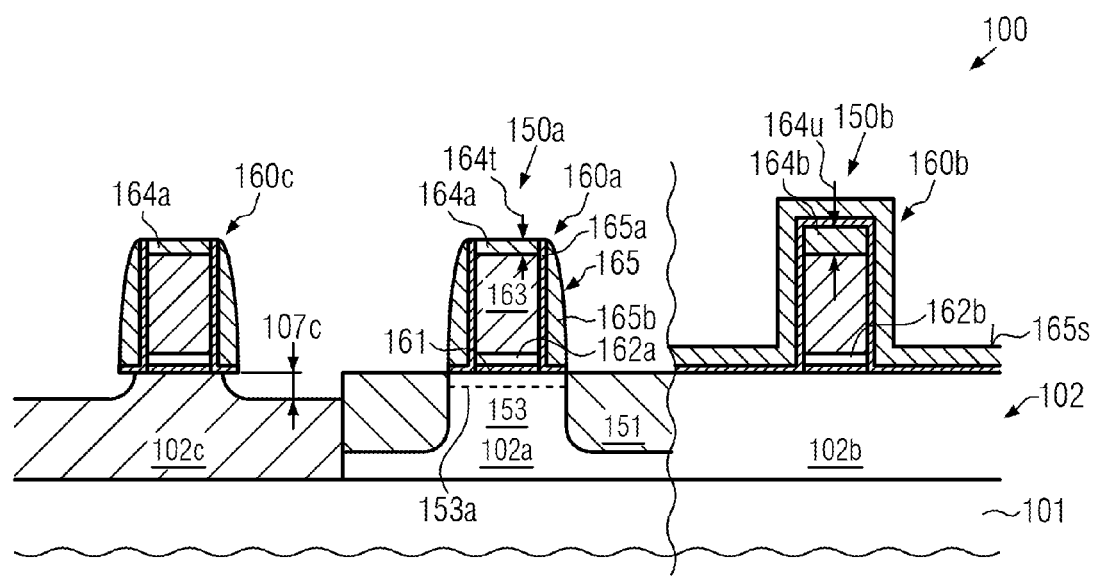
FIG. 1a schematically illustrates a cross-sectional view of a semiconductor device when forming a high-k metal gate electrode structure and an embedded silicon/germanium material in the presence of the high-k metal gate electrode structure, according to conventional strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides manufacturing techniques in which the difference in process history of the dielectric cap material of gate electrode structures may be taken into consideration by appropriately selectively reducing the thickness of the dielectric cap material in an early manufacturing stage in which an additional lithography and patterning process may not unduly affect any other device materials. To this end, in some illustrative embodiments, a selective reduction of thickness of the dielectric cap material may be implemented upon providing a gate layer stack and prior to actually patterning the gate layer stack into gate electrode structures. In some illustrative embodiments, the asymmetry of the material erosion during the further processing of the gate electrode structures upon incorporating an embedded strain-inducing semiconductor alloy into one type of transistor may be determined, for instance on the basis of experiments and applying appropriate measurement techniques, and any such measurement results may be taken into consideration upon selecting an appropriate reduction of the thickness of the cap material. In this manner, the dielectric cap materials may have a similar or substantially identical thickness after a process sequence for forming an embedded strain-inducing semiconductor material in one type of transistor. Consequently, the further processing may be continued on the basis of superior process conditions with respect to removing the dielectric cap material at any appropriate manufacturing stage, for example prior to forming the dielectric material of a contact level or after forming a dielectric material, for instance when applying a replacement gate approach.

Figure 1B:
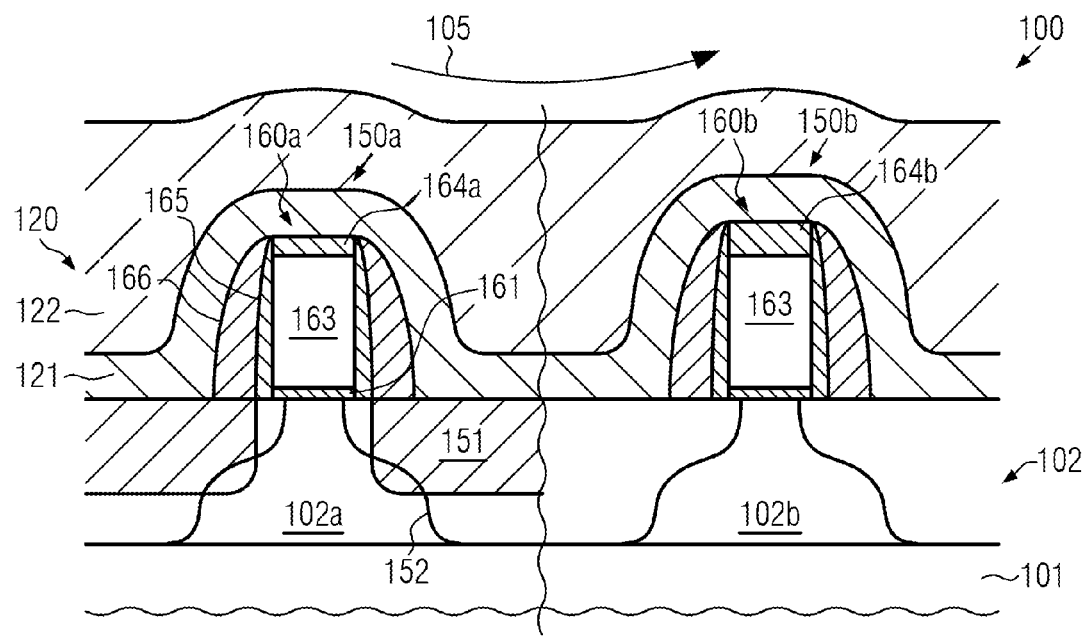
FIGS. 1b-1c schematically illustrate cross-sectional views of a conventional semiconductor device in various manufacturing stages when a high-k metal gate electrode structure is formed on the basis of a replacement gate approach with a strain-inducing silicon/germanium material being selectively embedded into P-channel transistors, according to conventional strategies.
Figure 1C:
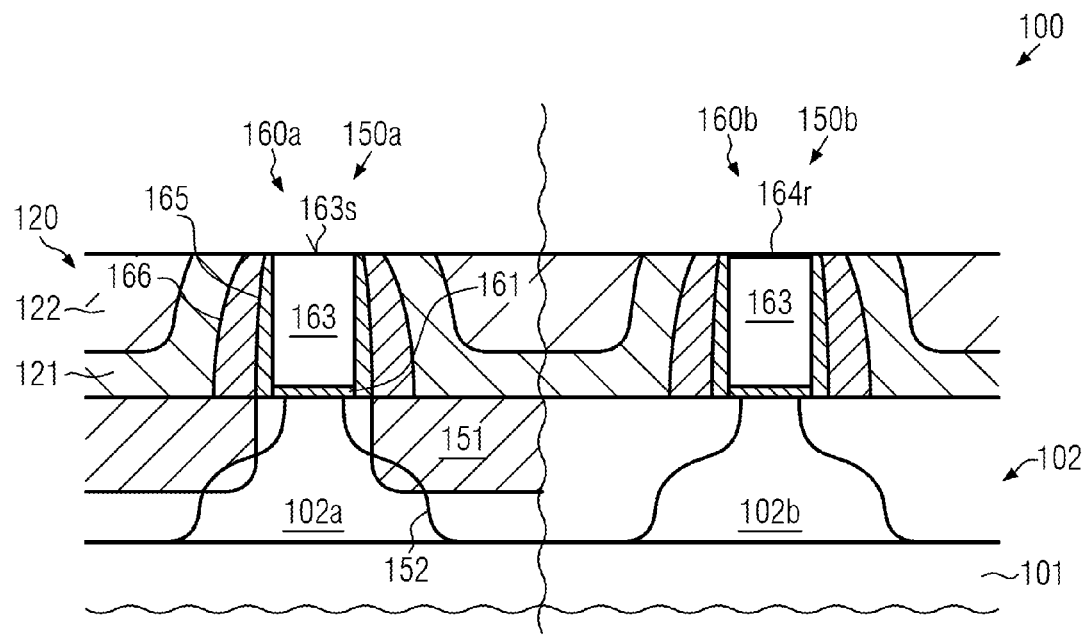

With reference to FIGS. 2a-2j, further illustrative embodiments will now be described in more detail, wherein reference may also be made to FIGS. 1a-1c, if appropriate, for instance when referring to certain process techniques, components and the like so as to avoid undue repetition of the description of any such components.

Figure 2A:
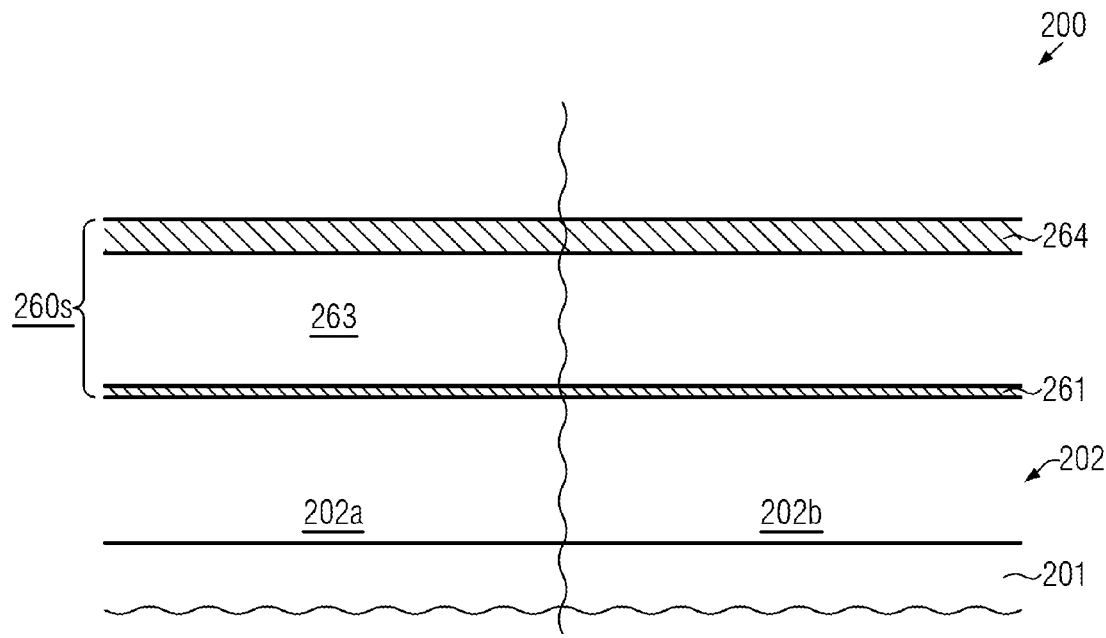
FIGS. 2a-2c schematically illustrate cross-sectional views of a semiconductor device in an early manufacturing stage, i.e., prior to patterning gate electrode structures from a gate layer stack, wherein a thickness of a dielectric cap material is selectively reduced for one type of transistor, according to illustrative embodiments.

FIG. 2a schematically illustrates a cross-sectional view of a semiconductor device 200 comprising a substrate 201 above which may be formed a semiconductor layer 202, such as a silicon layer or any other appropriate semiconductor material, the electronic characteristics of which may be enhanced by incorporating a strain-inducing semiconductor alloy, at least for one type of transistor. The semiconductor layer 202 is divided into a plurality of active regions, as is also discussed above with reference to the device 100. For example, a first active region 202a and a second active region 202b are illustrated in FIG. 2a, wherein the first active region 202a represents an active region that receives a strain-inducing semiconductor alloy, such as a silicon/germanium material, a silicon/tin material, a silicon/carbon material and the like, in order to enhance performance of a transistor to be formed in and above the active region 202a. On the other hand, the second active region 202b represents a region of a transistor that does not need the incorporation of a strain-inducing semiconductor material. For example, the transistors to be formed in and above the active regions 202a, 202b may represent complementary transistors. Furthermore, a gate layer stack 260s may be formed on the active regions 202a, 202b and may comprise a dielectric material 261, a material 263, which may be indicated as an electrode material or which may also act as a placeholder material, as will be described later on in more detail. Furthermore, a dielectric cap material 264 may be provided, for instance in the form of one or more dielectric layers, wherein typically silicon nitride may be incorporated in the dielectric material 264.

It should be appreciated that, in some illustrative embodiments, as will be described later on in more detail, the gate layer stack 260s may represent a stack of materials as are appropriate for forming sophisticated high-k metal gate electrode structures. To this end, the dielectric material 261 may comprise a high-k dielectric material, as is, for instance, also discussed above with reference to the device 100. Furthermore, in this case, an additional metal-containing electrode material (not shown) may be provided, for instance as a corresponding sub-layer in the material 263, wherein generally the material composition may be different in order to take into consideration different threshold voltage characteristics of different types of transistors, as is also discussed above. Moreover, in some illustrative embodiments, an additional threshold voltage adjusting semiconductor material (not shown) may be provided in one or both of the active regions 202a, 202b, depending on the overall device requirements. For example, frequently, an appropriate semiconductor alloy, such as a silicon/germanium alloy, may be provided at the surface of one active region, such as the active region 202a, as is also discussed above with reference to the device 100 of FIG. 1a.

In other cases, the gate layer stack 260s may have a substantially conventional configuration, i.e., for instance, a silicon dioxide material in the layer 261 in combination with a silicon material in the layer 263. The semiconductor device 200 may be formed on the basis of process techniques as are also described above with reference to the device 100. That is, the active regions 202a, 202b may be formed in accordance with process techniques described above, followed by the deposition and possibly the patterning of metal-containing electrode materials, followed by the deposition of the layers 263 and 264. To this end, any well-established process techniques may be applied, as are also described above.

Figure 2B:
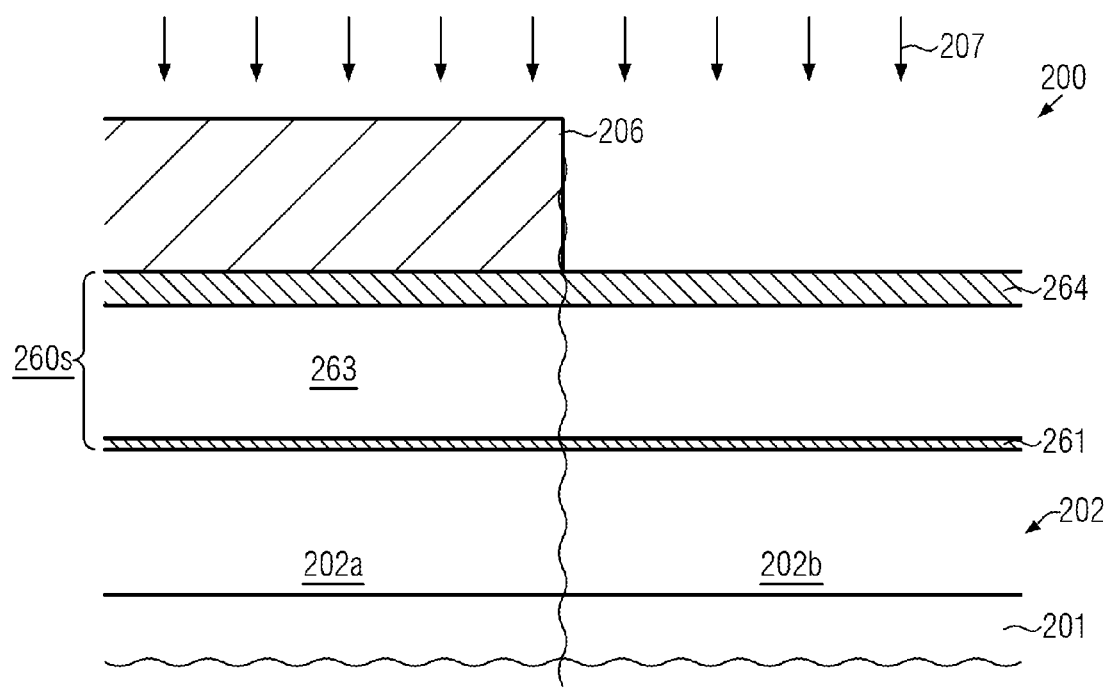

FIG. 2b schematically illustrates the device 200 with an etch mask 206 formed above the gate layer stack 260s in order to expose the dielectric cap material 264 above the second active region 202b. To this end, any well-established lithography techniques may be applied. Thereafter, an etch process 207, such as a wet chemical etch process, a plasma assisted etch process and the like, may be applied in order to remove material of the exposed portion of the cap layer 264. To this end, a plurality of well-established and well-controllable etch techniques are available. For example, plasma assisted etch recipes for etching silicon nitride material, silicon dioxide material and the like are available, while, in other cases, wet chemical etch chemistries, for instance on the basis of hot phosphoric acid and the like, may be applied. Typically, the etch process 207 may be controlled on the basis of the etch time for a given removal rate, which may be determined in advance in order to obtain a desired reduction of the thickness of the exposed portion of the cap layer 264. To this end, appropriate experiments may be performed. Moreover, as discussed above, an appropriate process recipe may be implemented by determining a desired magnitude of the reduction of thickness of the layer 264 on the basis of measurement results, which may be obtained by determining the degree of material erosion during a process sequence for selectively embedding a strain-inducing semiconductor material. For example, as previously discussed above with reference to the cap layers 164a, 164b having the different thickness 164t, 164u, respectively, the influence of the different process history due to the incorporation of a strain-inducing material may be determined. Hence, appropriate etch parameters for the process 207 may then be determined. In other cases, a thin etch stop material may be incorporated into the cap material 264, for instance on the basis of a silicon dioxide material (not shown), which may be positioned at a depth which may substantially correspond to the desired final thickness of the exposed portion of the cap material 264.

Figure 2C:
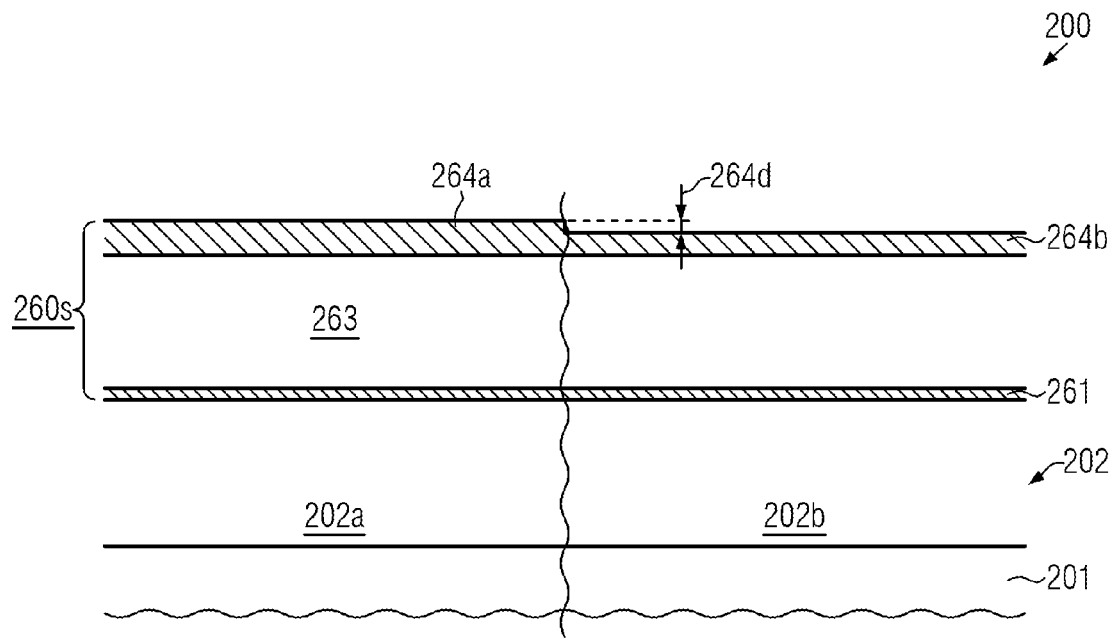

FIG. 2c schematically illustrates the device 200 after the removal of the etch mask 206 (FIG. 2b) and with a dielectric cap material 264a formed above the active region 202a and having substantially the initial thickness and material composition of the dielectric material 264 (FIG. 2b). On the other hand, a dielectric cap material 264b above the second active region 202b has a reduced thickness, wherein the difference 264d may substantially correspond to a difference that may be caused during the further processing of the device 200 and which may be determined on the basis of measurements and experiments, as discussed above. Thus, the reduction of the thickness as indicated by 264d may be selected so as to substantially compensate for the additional material erosion of the material 264a during the further processing when incorporating an embedded strain-inducing semiconductor material selectively in the active region 202a. For example, the thickness reduction 264d may be approximately 10-25 nm.

Figure 2D:
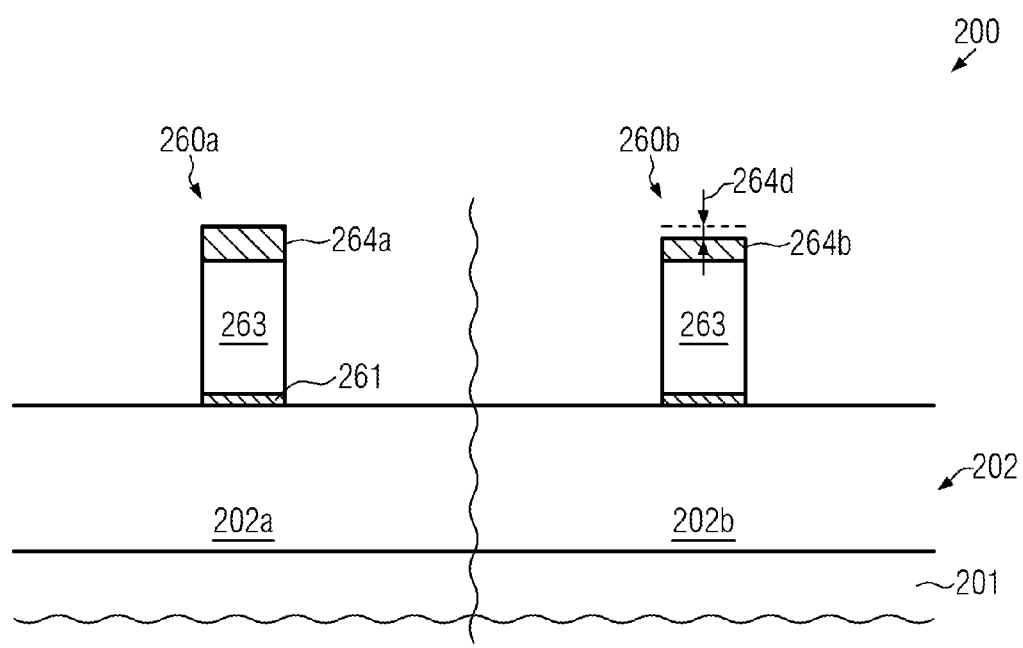
FIGS. 2d-2j schematically illustrate cross-sectional views of the semiconductor device during various manufacturing stages when forming sophisticated high-k metal gate electrode structures and an embedded strain-inducing semiconductor alloy in an early manufacturing stage and by using a replacement gate approach respectively, according to further illustrative embodiments.

FIG. 2d schematically illustrates the device 200 in a further advanced manufacturing stage. As shown, a first gate electrode structure 260a is formed on the active region 202a and comprises the cap layer 264a, while a second gate electrode structure 260b is formed on the second active region 202b and comprises the cap layer 264b having the reduced thickness 264d. It should be appreciated that the gate electrode structures 260a, 260b may be patterned on the basis of any well-established process strategy, for instance using double exposure-double etch process sequences, wherein the materials 264a, 264b may be efficiently used as hard mask materials, while, however, any other process strategy may be applied. In this manufacturing stage, one or more liner materials may be formed, for instance, by well-established deposition techniques, in order to form appropriate sidewall spacer elements and/or to reliably confine sensitive gate materials, such as any high-k dielectric materials, metal-containing electrode materials, as is also discussed above with reference to the device 100, as illustrated in FIG. 1*a*. To this end, appropriate spacer materials, such as silicon nitride, may be deposited and may be subsequently patterned so as to form at least one spacer structure on the gate electrode structure 260*a*, as is, for instance, described above in FIG. 1*a* when referring to the structure 165, wherein, also in this case, an appropriate liner material in combination with a spacer material may be used, while, in other cases, a single material layer may be deposited. As described above with reference to FIG. 1*a*, the corresponding spacer layer may be appropriately patterned by using an appropriate etch strategy in which also material of the active region 202*a* may be removed in order to form corresponding cavities therein. Hence, during this process sequence, material erosion in the cap layer 264*a* may occur, as is also discussed above.

Figure 2E:
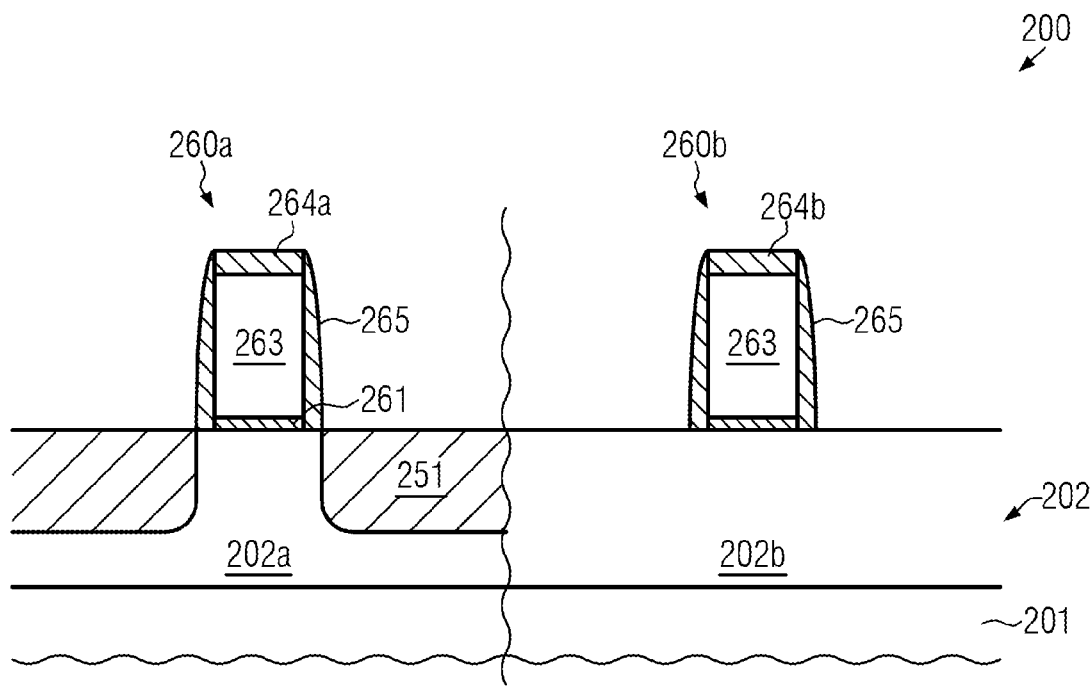

FIG. 2*e* schematically illustrates the device 200 in a further advanced manufacturing stage. As shown, a strain-inducing semiconductor material 251 is selectively formed in the active region 202*a*, which may be accomplished by applying a process strategy as is also described above with reference to the device 100 as shown in FIG. 1*a*. Furthermore, in this stage, a spacer structure 265, which may have been used for confining the materials 263 and 261 in the gate electrode structure 260*a*, may be provided, wherein the spacer structure 265 of the gate electrode structure 260*b* may have been formed after incorporating the material 251, as is also described above. Consequently, since the material 264*a* suffers from an increased material erosion upon incorporating the material 251, as described before, in the manufacturing stage shown in FIG. 2*e*, the layers 264*a*, 264*b* may have a very similar thickness due to the reduction of thickness in the material 264*b* as shown in FIG. 2*d*. Consequently, the further processing may be continued on the basis of superior process conditions, in particular with respect to the removal of the cap layers 264*a*, 264*b*.

Figure 2F:
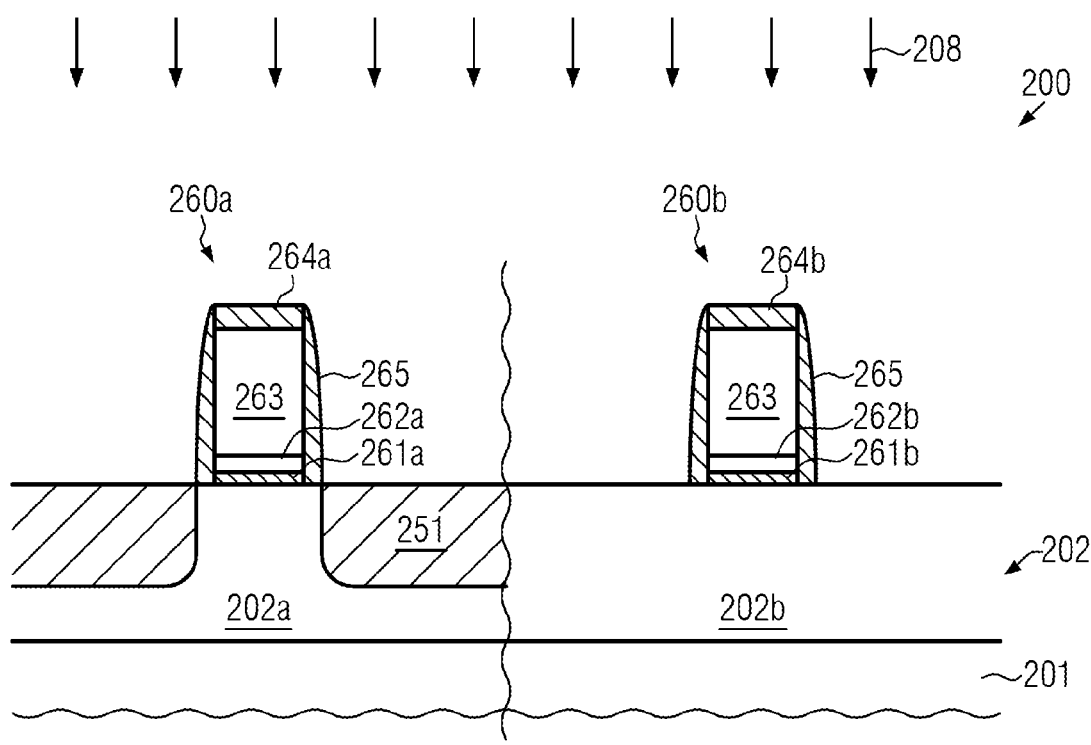

FIG. 2*f* schematically illustrates the device 200 during a removal process 208, which may be implemented in the form of a plasma assisted etch process in order to remove the cap layers 264*a*, 264*b*. In this embodiment, the gate electrode structures 260*a*, 260*b* represent metal gate electrode structures wherein the dielectric material 261 of the gate electrode 260*a* may comprise a layer 261*a* including a high-k dielectric material, possibly in combination with a conventional dielectric material (not shown), while the electrode material 263 may include a metal-containing electrode material 262*a*. Similarly, the dielectric material 261 of the gate electrode structure 260*b* may comprise a high-k dielectric layer 261*b*, while the material 263 may comprise a metal-containing electrode material 262*b*. It should be appreciated that, typically, one or both of the layers 261*a*, 262*a* may be different from one or both of the layers 261*b*, 262*b* so as to provide appropriate electronic characteristics of the corresponding gate electrode structures 260*a*, 260*b*. For example, different work function metal species may be incorporated in the dielectric material and/or the metal-containing electrode material of the gate electrode structures 260*a*, 260*b*, as is also discussed above. Hence, upon performing the process 208 as a plasma assisted etch process, undue erosion of the protective spacer material 265 and, thus, undue exposure of sensitive gate materials in critical areas, such as the recessed areas of gate electrode structures formed above an isolation region, as previously explained with reference to the gate electrode structure 160*c* in FIG. 1*a*, may be substantially avoided. Furthermore, the materials 263 may be reliably exposed on the basis of uniform etch conditions, thereby resulting in a uniform device configuration, while also undue over-etch times may be avoided due to the similar and reduced thickness of the dielectric cap materials 264*a*, 264*b*. In particular, the spacer structure 265 may not be unduly exposed to etch atmospheres and wet chemical etch chemistries since any additional masking and etch recipes may not be necessary for removing the dielectric cap materials. Thereafter, the further processing may be continued on the basis of highly uniform process conditions.

Figure 2G:
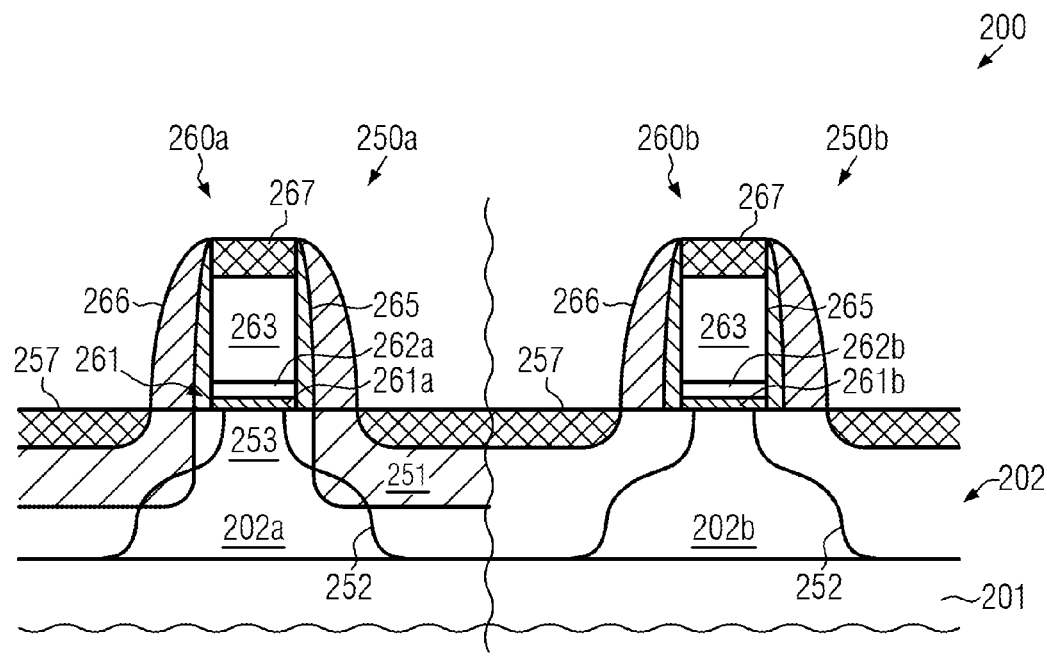

FIG. 2*g* schematically illustrates the device 200 in a further advanced manufacturing stage. As shown, a first transistor 250*a* is formed in and above the active region 202*a* and comprises drain and source regions 252 separated by a channel region 253, in which an appropriate strain may be induced due to the presence of the material 251. Moreover, metal silicide regions 257 may be provided in the drain and source regions 252. Similarly, a metal silicide 267 may be formed in the semiconductor-based electrode material 263 of the gate electrode structure 260*a*. Moreover, a sidewall spacer structure 266 may be formed on the spacer structure 265. The gate electrode structure 260*b* of a second transistor 250*b* may have substantially the same configuration as the gate electrode structure 260*a*, except for the differences of the materials 261*b*, 262*b* compared to the materials 261*a*, 262*a*, as discussed above. Furthermore, also drain and source regions 252 are provided in the active region 202*b*, which may be of different conductivity type compared to the drain and source regions 252 of the transistor 250*a*, when the transistors 250*a*, 250*b* are of different conductivity type. It should be appreciated that, if required, an additional semiconductor alloy, such as a silicon/germanium material, may be provided below the gate electrode structure 260*a*, if required for appropriately adjusting the threshold voltage of the transistor 250*a*.

The device 200 as shown in FIG. 2*g* may be formed on the basis of any appropriate process strategy. That is, the drain and source regions 252 may be formed on the basis of implantation techniques in combination with appropriate masking regimes, while also the spacer structure 266 may be formed, possibly in several steps, in order to provide the lateral masking effect together with the gate electrode structures 260*a*, 260*b*. After any high temperature processes, the metal silicide regions 257, 267 may be formed on the basis of well-established process techniques. Consequently, the transistors 250*a*, 250*b* may be formed with the high-k metal gate electrode structures 260*a*, 260*b*, which are provided in an early manufacturing stage, wherein undue gate failures due to erosion of sensitive gate materials may be avoided or at least significantly reduced due to the early patterning of the dielectric cap materials, as discussed above.

Figure 2H:
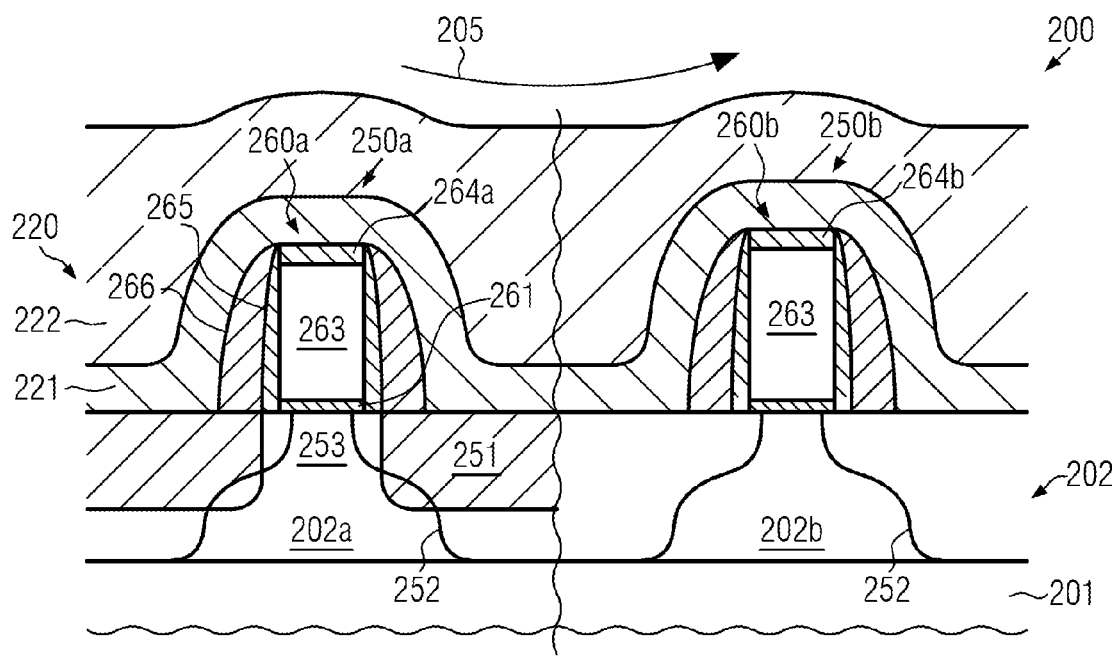
Figure 2I:
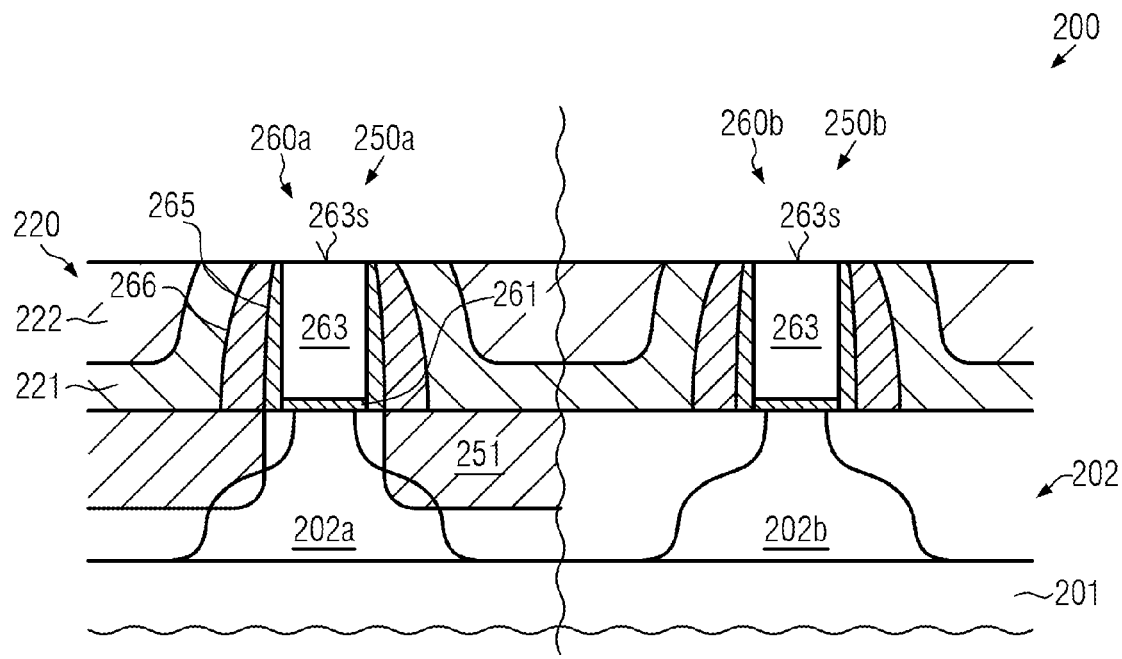
Figure 2J:
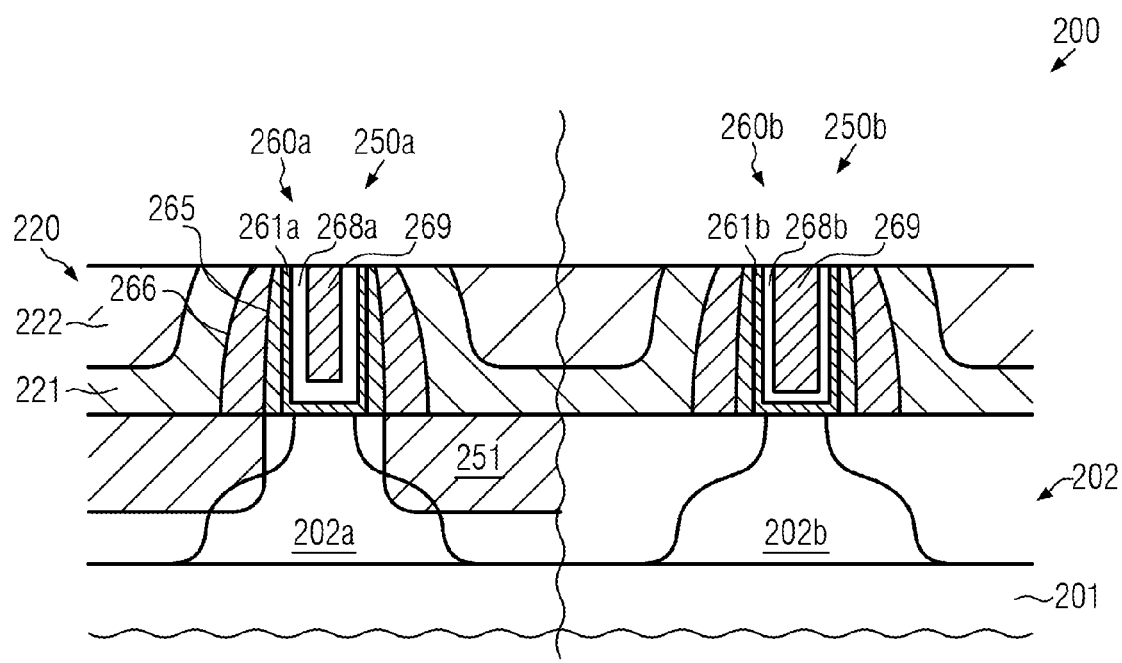

With reference to FIGS. 2*h*-2*j*, metal gate electrode structures of the device 200 may be formed on the basis of a replacement gate approach.

FIG. 2*h* schematically illustrates the device 200 in an advanced manufacturing stage. In this manufacturing stage, the transistors 250*a*, 250*b* may be formed on the basis of the gate electrode structures 260*a*, 260*b*, which may still comprise the dielectric cap materials 264*a*, 264*b*, which, however, compared to conventional gate approaches, may have a very similar thickness due to the early patterning of the initial dielectric cap material. Thus, the transistors 250*a* comprise the drain and source regions 252 and the sidewall spacer structure 266, wherein, in some cases, a metal silicide (not shown) may be formed in the drain and source regions 252, while, in other cases, a corresponding metal silicide may be formed in a later manufacturing stage. Furthermore, a contact level 220, including two or more dielectric layers 221, 222, may be formed above and laterally adjacent to the gate electrode structures 260a, 260b. For example, the layer 221 may represent a silicon nitride material, while the layer 222 may be comprised of a silicon dioxide material. It should be understood, however, that any other material composition may be used in the contact level 220. Thereafter, a material removal sequence 205 may be applied so as to remove and thus planarize the materials 221, 222 wherein, in a final phase of the sequence 205, the surface of the material 263, which now represents a placeholder material, is to be exposed by removing the cap layers 264a, 264b. Contrary to the conventional strategies, as described above with reference to the device 100 as shown in FIGS. 1b and 1c, superior process conditions may be encountered in the final phase of the sequence 205 due to the similar or substantially identical thickness of the cap layers 264a, 264b. Hence, the materials 263 may be exposed with superior uniformity compared to conventional strategies.

FIG. 2i schematically illustrates the device 200 in an advanced manufacturing stage in which surface areas 263s of the placeholder materials 263 are exposed with superior uniformity so that the probability of any material residues is significantly reduced compared to conventional strategies. Hence, the placeholder material 263 and possibly the dielectric material 261 may be removed on the basis of any appropriate process strategy, for instance, using highly selective wet chemical etch recipes, plasma assisted etch recipes and the like. Thereafter, appropriate materials may be incorporated, for instance, metal-containing electrode materials, possibly in combination with a high-k dielectric material and work function metal species.

FIG. 2j schematically illustrates the device 200 in a further advanced manufacturing stage. As shown, the gate electrode structure 260a may comprise a high-k dielectric material 261a in combination with a metal-containing electrode material 268a, wherein the layers 261a and/or 268a may comprise an appropriate work function adjusting species. Moreover, a metal-containing electrode material 269, such as aluminum, aluminum alloys and the like, may be provided. Similarly, the gate electrode structure 260b may comprise a high-k dielectric material 261b, a metal-containing electrode material 268b and the highly conductive electrode metal 269. Also in this case, one or both of the materials 261b, 268b may comprise a work function adjusting metal species. The gate electrode structures 260a, 260b as shown in FIG. 2j may be formed on the basis of the superior device configuration of FIG. 2i by applying any appropriate deposition and/or patterning strategy, followed by the removal of any excess material so as to obtain the gate electrode structures 260a, 260b as electrically insulated entities.

As a result, the present disclosure provides manufacturing techniques in which the dielectric cap material of a gate layer stack may be patterned in an early manufacturing stage so as to selectively reduce the thickness of the cap material, thereby efficiently compensating for an asymmetric process history of the dielectric cap materials due to the incorporation of the strain-inducing semiconductor alloy in one type of transistor.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a gate layer stack above a first active region and a second active region of a semiconductor device, said gate layer stack comprising a dielectric material, at least one electrode material formed above said dielectric material and a dielectric cap material having a first thickness formed above said at least one electrode material;
    selectively reducing a thickness of said dielectric cap material above said second active region from said first thickness to a second thickness, wherein selectively reducing said thickness comprises removing an upper portion of said dielectric cap material from above said second active region while leaving a lower portion of said dielectric cap material above said second active region;
    after selectively reducing said thickness of said dielectric cap material, patterning said gate layer stack so as to form a first gate electrode structure comprising said dielectric cap material having said first thickness above said first active region and a second gate electrode structure comprising said dielectric cap material having said second thickness above said second active region; and
    forming a strain-inducing semiconductor alloy selectively in said first active region.

2. The method of claim 1, further comprising removing said dielectric cap material from said first and second gate electrode structures prior to completing drain and source regions in said first and second active regions.

3. The method of claim 2, wherein said dielectric cap material is removed by a plasma assisted etch process.

4. The method of claim 3, wherein said plasma assisted etch process is performed without masking said first and second gate electrode structures.

5. The method of claim 1, wherein forming said gate layer stack comprises forming said dielectric material so as to comprise a high-k dielectric material.

6. The method of claim 5, wherein forming said gate layer stack further comprises forming a metal-containing electrode material above said dielectric material and forming a semiconductor-based electrode material above said metal-containing electrode material.

7. The method of claim 6, further comprising removing said dielectric cap material from said first and second gate electrode structures after forming drain and source regions in said first and second active regions.

8. The method of claim 6, further comprising replacing said semiconductor-based electrode material with a second metal-containing electrode material after removal of said dielectric cap material.

9. The method of claim 1, further comprising removing said dielectric cap material from said first and second gate electrode structures after forming drain and source regions in said first and second active regions.

10. The method of claim 9, further comprising removing said at least one electrode material from said first and second gate electrode structures after removal of said dielectric cap material from said first and second gate electrode structures.

11. The method of claim 1, further comprising;
    determining in advance a difference in material erosion between said dielectric cap material of said first gate electrode structure and said dielectric cap material of said second gate electrode structure during a processing sequence that is used to form said strain-inducing semiconductor layer in said first active region; and controlling said second thickness so as to substantially compensate for said difference.

12. A method of forming a semiconductor device, the method comprising:

forming a gate layer stack above a first active region and a second active region, said gate layer stack comprising a high-k dielectric material, a metal-containing electrode material formed above said high-k dielectric material, a semiconductor-based electrode material formed above said metal-containing electrode material and a dielectric cap material having a first thickness formed above said semiconductor-based electrode material;

selectively reducing a thickness of said dielectric cap material above said second active region from said first thickness to a second thickness, wherein selectively reducing said thickness comprises removing an upper portion of said dielectric cap material from above said second active region while leaving a lower portion of said dielectric cap material above said second active region;

after selectively reducing said thickness of said dielectric cap material, patterning said gate layer stack so as to form a first gate electrode structure comprising said dielectric cap material having said first thickness above said first active region and a second gate electrode structure comprising said dielectric cap material having said second thickness above said second active region;

forming a strain-inducing semiconductor alloy selectively in said first active region; and removing said dielectric cap material from said first and second gate electrode structures after forming said strain-inducing semiconductor alloy.

13. The method of claim 12, further comprising forming a protective liner on sidewalls of said first and second gate electrode structures prior to forming said strain-inducing semiconductor alloy.

14. The method of claim 12, wherein removing said dielectric cap material comprises performing a plasma assisted etch process.

15. The method of claim 14, wherein said plasma assisted process is performed without masking said first and second gate electrode structures.

16. The method of claim 12, further comprising forming a metal silicide in said semiconductor-based electrode material of said first and second gate electrode structures after removing said dielectric cap material.

17. The method of claim 12, further comprising forming a first transistor of a first conductivity type in and above said first active region and forming a second transistor of a second conductivity type in and above said second active region, wherein said second conductivity type is inverse to said first conductivity type.

18. A method of forming a semiconductor device, the method comprising:

forming a gate layer stack above a first active region and a second active region, said gate layer stack comprising a dielectric material, a placeholder electrode material formed above said dielectric material and a dielectric cap material having a first thickness formed above said placeholder electrode material;

selectively reducing a thickness of said dielectric cap material above said second active region from said first thickness to a second thickness, wherein selectively reducing said thickness comprises removing an upper portion of said dielectric cap material from above said second active region while leaving a lower portion of said dielectric cap material above said second active region;

after selectively reducing said thickness of said dielectric cap material, patterning said gate layer stack so as to form a first gate electrode structure comprising said dielectric cap material having said first thickness above said first active region and a second gate electrode structure comprising said dielectric cap material having said second thickness above said second active region;

forming a strain-inducing semiconductor alloy selectively in said first active region;

removing said dielectric cap material from said first and second gate electrode structures after forming said strain-inducing semiconductor alloy; and replacing said placeholder electrode material with a metal-containing electrode material after removal of said dielectric cap material.

19. The method of claim 18, further comprising forming a dielectric material above and laterally adjacent to said first and second gate electrode structures and planarizing said dielectric material.

20. The method of claim 19, wherein planarizing said dielectric material comprises removing said dielectric cap material from said first and second gate electrode structures so as to expose said placeholder electrode material.

* * * * *